(12) United States Patent
Lu et al.

(10) Patent No.: US 12,002,516 B2
(45) Date of Patent: Jun. 4, 2024

(54) MEMORY BLOCK CHARACTERISTIC DETERMINATION

(71) Applicant: Micron Technology, Inc., Boise, ID (US)

(72) Inventors: Zhongyuan Lu, Boise, ID (US); Niccolo' Righetti, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 112 days.

(21) Appl. No.: 17/831,350

(22) Filed: Jun. 2, 2022

(65) Prior Publication Data

US 2023/0395156 A1    Dec. 7, 2023

(51) Int. Cl.
| | | |
|---|---|---|
| *G11C 16/16* | (2006.01) | |
| *G11C 7/04* | (2006.01) | |
| *G11C 16/08* | (2006.01) | |
| *G11C 16/26* | (2006.01) | |
| *G11C 16/32* | (2006.01) | |

(52) U.S. Cl.
CPC ............... *G11C 16/16* (2013.01); *G11C 7/04* (2013.01); *G11C 16/08* (2013.01); *G11C 16/26* (2013.01); *G11C 16/32* (2013.01)

(58) Field of Classification Search
CPC ........... G11C 16/16; G11C 7/04; G11C 16/08; G11C 16/26; G11C 16/32
USPC ......................................................... 365/211
See application file for complete search history.

(56) References Cited

U.S. PATENT DOCUMENTS

| | | |
|---|---|---|
| 8,189,379 B2 | 5/2012 | Camp et al. |
| 2007/0183220 A1 | 8/2007 | Aritome |
| 2012/0163092 A1 | 6/2012 | Jung et al. |
| 2015/0092488 A1 | 4/2015 | Wakchaure et al. |
| 2018/0277173 A1* | 9/2018 | Takizawa ........... G11C 16/3459 |
| 2019/0252024 A1* | 8/2019 | Watanabe .............. G11C 16/08 |

\* cited by examiner

*Primary Examiner* — Huan Hoang
(74) *Attorney, Agent, or Firm* — Brooks, Cameron & Huebsch, PLLC

(57) ABSTRACT

Bake temperatures for memory blocks can be determined as part of an operation to allocate memory blocks for us by a memory device. If a temperature of a particular memory block among the plurality of memory blocks meets or exceeds a threshold operational temperature corresponding to a memory device containing the plurality of memory blocks, the particular memory block can be allocated for receipt and/or storage of data.

24 Claims, 5 Drawing Sheets

MEMORY BLOCK CHARACTERISTIC DETERMINATION

TECHNICAL FIELD

Embodiments of the disclosure relate generally to memory sub-systems, and more specifically, relate to memory block characteristic determination.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
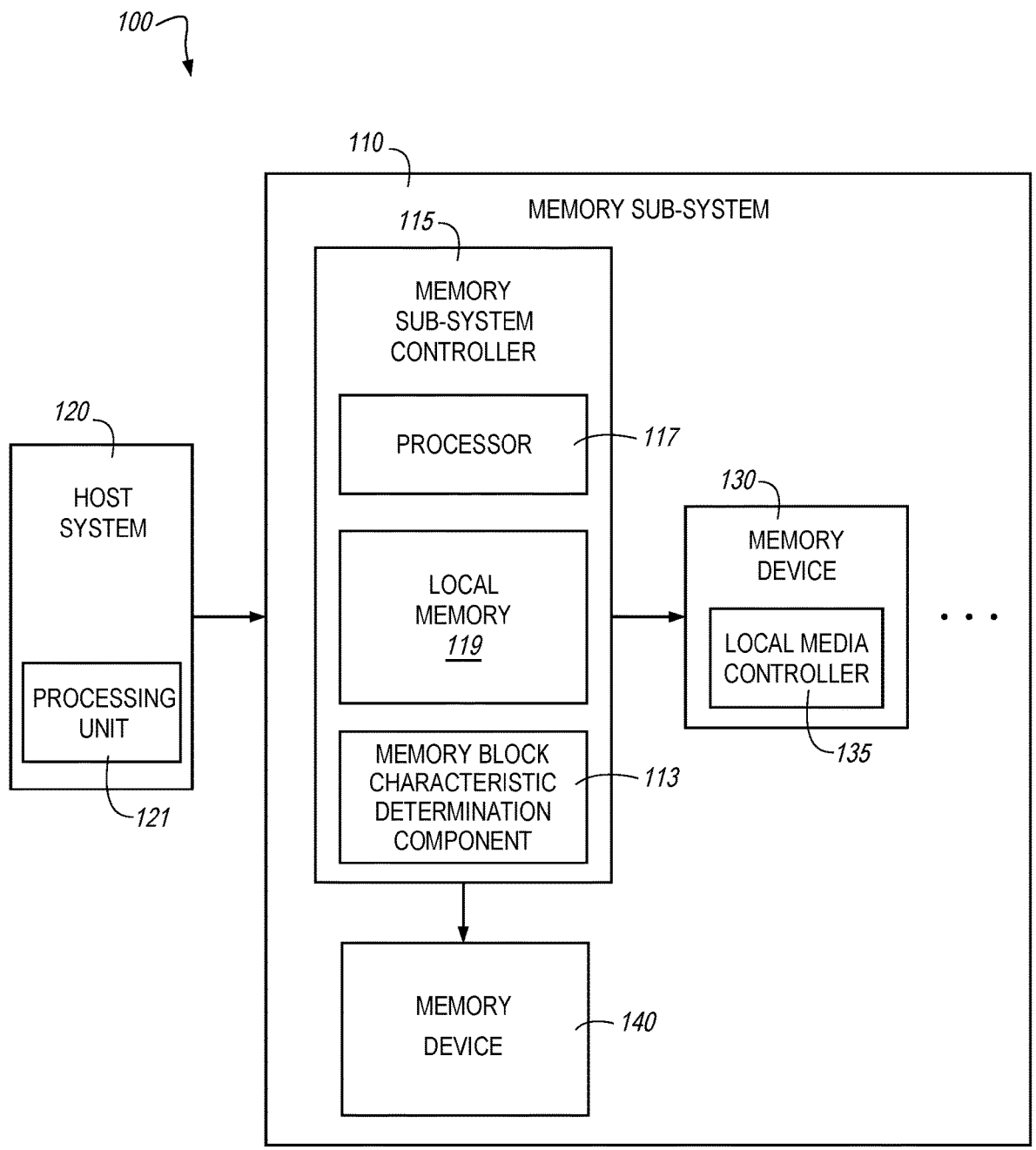
FIG. 1 illustrates an example computing system that includes a memory sub-system in accordance with some embodiments of the present disclosure.

Aspects of the present disclosure are directed to memory block characteristic determination in a memory sub-system, and in particular to memory sub-systems that include circuitry, such as a memory block characteristic determination component, to determine characteristics of memory blocks in a memory sub-system and take an action to control allocation of said memory blocks for use in memory operations. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be grouped into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area that can be erased. Pages cannot be erased individually, and only whole blocks can be erased.

Each of the memory devices can include one or more arrays of memory cells. Depending on the cell type, a cell can store one or more bits of binary information, and has various logic states that correlate to the number of bits being stored. The logic states can be represented by binary values, such as "0" and "1", or combinations of such values. There are various types of cells, such as single level cells (SLCs), multi-level cells (MLCs), triple level cells (TLCs), and quad-level cells (QLCs). For example, a SLC can store one bit of information and has two logic states, while a TLC can store multiple bits of information and has eight logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines. While both floating-gate architectures and replacement-gate architectures employ the use of select gates (e.g., select gate transistors), replacement-gate architectures can include multiple select gates coupled to a string of NAND memory cells. Further, replacement-gate architectures can include programmable select gates.

During the life and operation of the memory device, and, particularly during the life of a memory device that utilizes non-volatile memory technology, data written to memory cells of the memory device and/or the memory cells of the memory device themselves can degrade, thereby decreasing the accuracy of the data written to the memory cells when such data is retrieved. For example, the ability of the memory cells to retain data accurately and/or provide accurate data in response to receipt of a memory access request can decrease over time. Stated alternatively, NAND memory cells can generally only store data for a finite amount of time and/or sustain a finite quantity of erase cycles before the memory cells begin to fail to accurately retain data and/or become unusable.

In some examples, the degradation of data written to the memory cells can occur as a result of read disturb effects, data retention (e.g., an amount of time that the data is stored by the memory cells), and/or a quantity of program-erase cycles (PECs) experienced by the memory cells. These effects can be especially pronounced at a valley (e.g., $V_0$) between a lowest program state and a second lowest program state associated with a memory cell and/or an edge (e.g., $E_0$) of the $V_0$. As will be appreciated, the valley can correspond to a low voltage in comparison to voltages that correspond to a program state (e.g., peaks) on either side of the valley. In general, the effects of the degradation described above can lead to unacceptable degradation at the $E_0$ and/or $V_0$ threshold voltages associated with a memory cell. Although generally described herein in terms of the $V_0$ valley between the lowest program state and the second lowest program state, it will be appreciated that the effects of such degradation that can also occur at a valley (e.g., $V_1$)

between a second lowest program state and a third lowest program state associated with a memory cell and/or an edge (e.g., $E_1$) of such valleys, and so on and so forth, are contemplated by the present disclosure.

Stated alternatively, for two adjacent levels of a NAND memory cell (e.g., $L_0$ and $L_1$), $E_0$ corresponds to a voltage difference between a threshold read voltage at a given raw bit error rate (RBER) and the level $L_0$. Similarly, $E_1$ corresponds to a voltage difference between the threshold read voltage at a given raw bit error rate (RBER) and the level $L_1$. In general, $V_0 = E_0 + E_1$ (or, more generally, $V_x = E_{2x} + E_{2x+1}$). As will be appreciated, the levels $L_0$ and $L_1$ can represent portions of a voltage distribution curve associated with programming voltages of a memory cell. Accordingly, the values $V_0$, $E_0$, and $E_1$ can be indicative of a programming voltage with respect to a voltage valley located between the levels $L_0$ and $L_1$. Further, it will be appreciated that, for MLCs, TLCs, etc., more than two levels (e.g., $L_0$ to $L_y$) and hence, more than two "E" values (e.g., $E_0$ to $E_{2y-1}$), as well as more than one "V" (e.g., $V_0$ to $V_x$) are contemplated within the scope of the disclosure. In an illustrative TLC example, where there are eight levels ($L_0$ to $L_7$), there are seven valleys ($V_0$ to $V_6$) and thirteen edges ($E_0$ to $E_{13}$) associated with the overall read budget window.

In some approaches, a technique referred to as "erase-on-demand" (EoD) is employed to minimize the degradation at the $E_0$ and/or $V_0$ threshold voltages associated with a memory cell. Although such approaches can allow for some degradation arising from fail mechanisms such as data retention and/or read disturb effect to be mitigated, EoD paradigms can incur unacceptable latencies, particularly in enterprise class memory devices. For example, the latencies incurred in performing EoD operations using large-scale memory device deployments in an enterprise architecture can become pronounced enough that the memory device no longer provides a quality of service (QoS) that is either promised by the manufacturer of the memory device or is expected by a consumer of the memory device.

Further, EoD paradigms generally, especially in the case of memory blocks that contain invalid data, mark blocks as containing invalid data, then the blocks are allowed to sit being exposed to the temperature of the memory system (e.g., are allowed to "bake" as described in more detail, herein), and are then erased and programmed back-to-back when the memory block is allocated for receipt of new data. Such approaches can fail to account for changes to the temperature of the memory block as a result of fluctuating temperatures of the memory device after the data is flagged as invalid and/or the amount of time at which the memory block sits at such temperatures prior to being erased.

Further, some approaches can employ techniques reduce the latency involved in programming memory cell wherein memory blocks may be erased and then allowed to languish at the temperature of the memory system until such memory blocks are to be allocated for receipt of new data. This can allow for a bake temperature of the memory blocks to be more accurately known at the time of programming. However, such paradigms may fail to apply block selection processes to the erased blocks in favor of random block selection, which can effectively reduce or eliminate benefits to the $E_0$ that can result from allowing the blocks to be "baked" prior to programming.

In contrast, embodiments described herein can employ a modified paradigm to more accurately assess the temperature of the memory blocks and/or to account for effects resulting from the amount of time that the memory blocks have been exposed to the temperature. In the modified paradigms for memory block characteristic determination described herein, particular memory blocks are selected, ranked, and/or otherwise monitored based on characteristics (e.g., the sorting and/or ranking described in more detail in connection with FIG. 3, herein) of the memory blocks in contrast to the schemes of the previous approaches described above where the memory blocks are randomly selected and/or may be erased and then allowed to languish at the temperature of the memory system until such memory blocks are to be allocated for receipt of new data, in accordance with the modified schemes herein, such memory blocks can be sorted, ranked, and utilized based on characteristics such as determined bake temperatures and/or bake times. Accordingly, the memory blocks can be programmed while taking into account the current temperature of such blocks and, by extension, the amount of time that the memory blocks have been subjected to the temperature (e.g., the bake temperature, described in more detail, herein) in a systematic and determined manner as opposed to EoD paradigms and/or the other paradigms of previous approaches mentioned above. This can allow for embodiments of the present disclosure to prioritize memory cells and/or memory blocks that have experienced a higher bake temperature as opposed to prioritization of the time between erase operations and program operations as seen in previous approaches. As used herein, the "bake temperature" generally refers to a temperature that memory blocks are exposed to during operation of a memory sub-system. The "bake time" generally refers to an amount of time that the memory blocks are exposed to a particular bake temperature.

Further, conventional approaches generally fail to monitor or provide $E_0$ and/or $V_0$ threshold voltage mitigation based on a temperature experienced by the memory cells (and hence memory blocks of the memory device) and/or a duration of time that the memory cells have been exposed to such temperatures. For example, as the temperature of the memory device increases (e.g., during operation, as a result of experienced workloads, etc.), the temperature of the memory cells and memory blocks of the memory device generally increases as well. The temperatures experienced by the memory cells can play a role in memory cells degradation associated with $E_0$ and/or $V_0$ threshold voltages (among other threshold voltages associated with the memory cells). By failing to take temperature and/or time at temperature information into account, such approaches may fail to account for charge gain that can affect the $E_0$ and/or $V_0$ margins. This can lead to scenarios in which improvement of the $E_0$ and/or $V_0$ margins is not realized, thereby allowing for unacceptable degradation at the $E_0$ and/or $V_0$ threshold voltages associated with a memory cell.

Aspects of the present disclosure address the above and other deficiencies by monitoring and recording temperatures of blocks of the memory device (e.g., the "bake temperature" of the memory blocks) and/or a duration of time (e.g., the "bake time" of the memory blocks) for which the memory blocks have been exposed to the "bake temperature." In some embodiments, the memory blocks can be "empty memory blocks," which generally refer to memory blocks that have either never had data written thereto, memory blocks that have been erased (e.g., "erase blocks"), and/or memory blocks that are ready to be erased (e.g., "free blocks").

In some embodiments, the memory device (e.g., a controller, processing device, or other hardware control circuitry associated with the memory device) can determine that the memory device is experiencing greater than a threshold operational temperature and, responsive to such a determination, monitor and record the temperatures of the empty memory blocks. The memory device can then cause the empty memory blocks to be recorded and/or ranked (e.g., in a list) based on their respective bake temperatures and/or bake times in contrast to the EoD and/or the simplistic paradigms of other approaches mentioned above that fail to monitor, rank, and ultimately select particular memory blocks based on such characteristics for future allocation. For example, the memory device can cause addresses associated with the empty memory blocks to be recorded and/or ranked based on their respective bake temperatures and/or bake times.

The particular empty memory blocks can then be allocated for data storage based on the monitored and/or ranked characteristics, such as the respective bake temperatures and/or bake times, as described in more detail herein. By allocating the empty memory blocks for data storage in response to the determination that the memory devices is experiencing an operational temperature that meets or exceeds the operational temperature threshold and based on characteristics of the empty memory blocks, such as the respective bake temperatures and/or bake times, the $E_O$ and/or $V_O$ margins can be improved in comparison to previous approaches, thereby allowing for degradation at the $E_O$ and/or $V_O$ threshold voltages associated with a memory cell to be reduced or otherwise mitigated.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 includes a processing device 121. The processing unit 121 can be a central processing unit (CPU) that is configured to execute an operating system. In some embodiments, the processing unit 121 comprises a complex instruction set computer architecture, such an x86 or other architecture suitable for use as a CPU for a host system 120.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via the same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include a memory block characteristic determination component 113. Although not shown in FIG. 1 so as to not obfuscate the drawings, the memory block characteristic determination component 113 can include various circuitry to facilitate performance of operations to determine characteristics of memory blocks of the memory device as part of performance of the operations described herein. In some embodiments, the characteristics that can be determined by the memory block characteristic determination component 113 can include a temperature (e.g., a bake temperature) of memory blocks of the memory device and/or an amount of time (e.g., a bake time) for which the memory blocks of the memory device have been exposed to the temperature.

Further, the memory block characteristic determination component 113 can, in some embodiments, perform operations to cause the memory blocks to be recorded and/or ranked (e.g., in a list) based on their respective bake temperatures and/or bake times. As described in more detail herein, the memory blocks can be empty memory blocks (e.g., memory blocks that have never been written to, memory blocks that have undergone one or more erase cycles, and/or memory blocks that contain data, such as invalid data, that are awaiting erasure). The memory block characteristic determination component 113 may be referred to herein in the alternative as a "controller," a "processing device," or a "processor," given the context of the disclosure.

Although the memory block characteristic determination component 113 is illustrated as being resident on the memory sub-system controller 115, embodiments are not so limited. For example, the memory block characteristic determination component 113 can be resident on the memory device 130 (e.g., resident on the local media controller), or can be resident on other component of the memory sub-system 110. As used herein, the term "resident on" refers to something that is physically located on a particular component. For example, the memory block characteristic determination component 113 being "resident on" the memory sub-system controller 115 refers to a condition in which the hardware circuitry that comprises the memory block characteristic determination component 113 is physically located on the memory sub-system controller 115. The term "resident on" can be used interchangeably with other terms such as "deployed on" or "located on," herein.

In some embodiments, the memory sub-system controller 115 includes at least a portion of the memory block characteristic determination component 113. For example, the memory sub-system controller 115 can include a processor 117 (processing device) configured to execute instructions stored in local memory 119 for performing the operations described herein. In some embodiments, the memory block characteristic determination component 113 is part of the host system 110, an application, or an operating system.

In some embodiments, the memory sub-system 110, and hence the memory block characteristic determination component 113, can be resident on a mobile computing device such as a smartphone, laptop, phablet, Internet-of-Things device, autonomous vehicle, or the like. As used herein, the term "mobile computing device" generally refers to a hand-held computing device that has a slate or phablet form factor. In general, a slate form factor can include a display screen that is between approximately 3 inches and 5.2 inches (measured diagonally), while a phablet form factor can include a display screen that is between approximately 5.2 inches and 7 inches (measured diagonally). Examples of "mobile computing devices" are not so limited, however, and in some embodiments, a "mobile computing device" can refer to an IoT device, among other types of edge computing devices.

Figure 2:
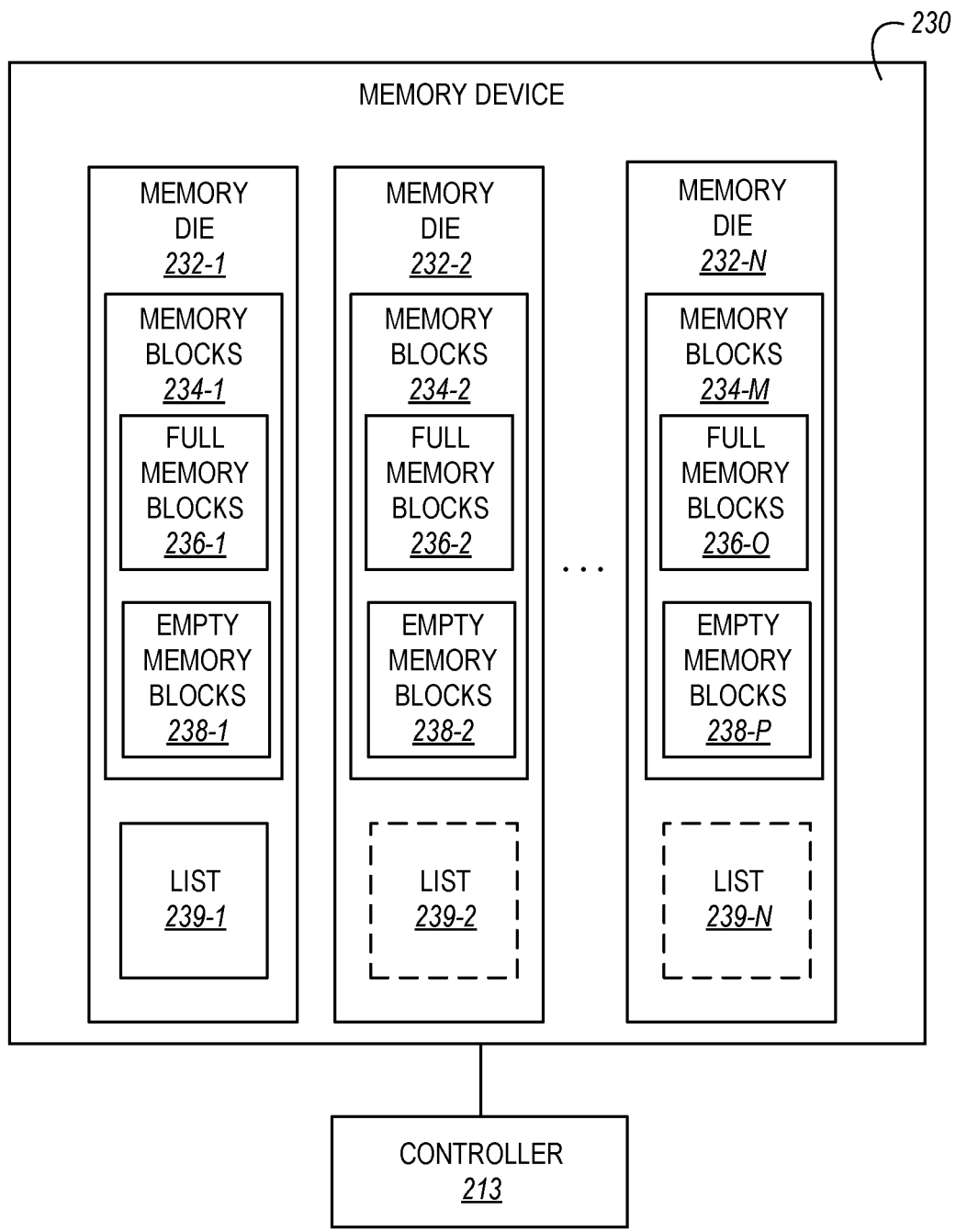
FIG. 2 illustrates an example memory device in accordance with some embodiments of the present disclosure.

FIG. 2 illustrates an example memory device 230 in accordance with some embodiments of the present disclosure. The memory device 230 can be analogous to the memory device 130 illustrated in FIG. 1, herein. As shown in FIG. 2, the memory device 230 includes various memory dice 232 (e.g., the memory die 231-1, the memory die 232-1, . . . , the memory die 232-N). The memory dice 232 can, in some embodiments, include memory blocks 234-1 to 234-M (e.g., groups of NAND memory cells that can include combinations of SLCs, MLCs, TLCs, QLCs, and beyond). However, in at least one embodiment, one or more of the memory blocks 234-1 to 234-M includes one or more groups of memory cells that includes TLCs and/or QLCs. In some embodiments, the NAND memory cells can be grouped as blocks of memory cells, pages of memory cells, word line groups comprising memory cells, and/or superblocks of memory cells, among others.

The memory blocks 234-1 to 234-M can include various sets of full memory blocks 236-1 to 236-O and/or various sets of empty memory blocks 238-1 to 238-P. As used herein, "full memory blocks" (e.g., the full memory blocks 236-1 to 236-O) have data written thereto. In general, the data written to the full memory blocks 236-1 to 236-O can be valid data. Conversely, as used herein, "empty memory blocks" (e.g., the empty memory blocks 238-1 to 238-P) either do not have data written thereto or have invalid data written thereto. Accordingly, the empty memory blocks 238-1 to 238-P can be allocated either as memory blocks to which data may be immediately written or can be allocated as memory blocks to which data may be written subsequent to performance of an erase operation to purge any invalid data written to the empty memory blocks 238-1 to 238-P. In some embodiments, the empty memory blocks 238-1 to 238-P may not be subjected to performance of an erase-on-demand operation and/or may not be subject to a conventional operation in which characteristics of the memory blocks are not considered when erasing the memory blocks).

For example, as described above, the empty memory blocks may be subjected to a modified "just-in-time" erase operation in which memory blocks that are to be erased (e.g., memory blocks that contain invalid data) are selected based on characteristics of the blocks, erased and then are then exposed to the bake temperature until just prior to allocation of the empty memory blocks 238-1 to 238-P as memory blocks to which data can be written. That is, embodiments of the present disclosure allow for empty memory blocks 238-1 to 238-P to be selected based on the bake temperature and/or the bake time of the memory blocks to be erased according to a modified "just-in-time" scheme (in which characteristics of the empty memory blocks 238-1 to 238-P, such as the bake temperature and/or the bake time are considered) where a subsequent program operation involving the empty memory blocks 238-1 to 238-P is performed as close to the current bake temperature of the empty memory blocks 238-1 to 238-P as practicable, as opposed to erased "on demand," in which the empty memory blocks 238-1 to 238-P are generally marked as containing invalid data, then allowed to "bake" (e.g., sit at a bake temperature for a period of time), and then erased and programmed and/or traditional schemes in which the empty memory blocks 238-1 to 238-P are arbitrarily selected without regard to bake temperatures and/or bake times. Accordingly, embodiments herein can allow for the effects of the bake temperature and/or the bake time of particular empty memory blocks 238-1 to 238-P to be adequately taken into consideration. Because this can allow for the bake temperature and/or the bake time to be fully considered, embodiments herein allow for improvements in the accuracy of the actual bake temperature of the empty memory blocks 238-1 to 238-P in comparison to other approaches.

At least one of the memory dice 232-1 to 232-N can be configured to store a list 239-1 to 239-N. The list 239-1 to 239-N can, as described below, include a ranked listing of the empty memory blocks 238-1 to 238-P based on their respective bake temperatures and/or their respective bake times. Although each memory die 232-1 to 232-N is shown in FIG. 2 as including such a list 239-1 to 239-N, embodiments herein provide that the list (e.g., the list 239-1) is maintained only in one of the memory dice (e.g., the memory die 232-1), the lists (e.g., the lists 239-1 and 239-2, the lists 239-2 and 239-N, and/or the lists 239-1 and 239-N) are maintained in more than one memory die 232-1 to 232-N, or each memory die 232-1 to 232-N includes a respective list 239-1 to 239-N. The lists 239-1 to 239-N can include storage locations (e.g., memory cells) configured to store data, such as an address location(s), associated with the empty memory blocks 238-1 to 238-P.

As illustrated in FIG. 2, the memory device 230 is coupled to a controller 213, which can be analogous to the memory block characteristic determination component 113 illustrated in FIG. 1. As described above, the controller 213 can include special purpose circuitry in the form of an ASIC, FPGA, state machine, and/or other logic circuitry that can allow the controller 213 to orchestrate and/or perform operations described herein involving the memory device 230 and/or the memory dice 232. The controller 213 can be referred to in the alternative as a "processor" or "processing device" in the context of the disclosure. Each of the components (e.g., the memory device 230, the memory dice 232, and/or the controller 213) can be referred to collectively or individually as an "apparatus."

In some embodiments, the controller 213 can determine that the memory device 230 and/or a memory sub-system, such as the memory sub-system 110 of FIG. 1, in which the memory device is deployed 230 has reached a threshold operating temperature. The threshold operating temperature can be associated with the memory device 230 being exposed to a "high" (e.g., at the high end of a normal operating temperature or above) temperature due to operational conditions, workloads executed by the memory device 230, and/or other factors that can affect the thermal characteristics of the memory device 230. In some embodiments, the threshold operating temperature can be around 85° Celsius.

In response to determining that the memory device 230 and/or the memory sub-system has reach (or exceeded) the threshold operating temperature, the controller 213 can determine temperatures (e.g., "bake temperatures") for the empty memory blocks 238-1 to 238-P. In addition to, or in the alternative, the controller 213 can determine an amount of time (e.g., the "bake time") the empty memory blocks 238-1 to 238-P have been exposed to the bake temperature. The controller 213 can then cause the empty memory blocks 238-1 to 238-P to be organized in a list 239-1 to 239-N and/or ranked from the highest bake temperature to the lowest bake temperature.

For example, if the empty memory blocks 238-1 are at a determined temperature of 75° Celsius, the empty memory blocks 238-2 are at a determined temperature of 85° Celsius, and the empty memory blocks 238-P are at a determined temperature of 70° Celsius, the controller can rank the empty memory blocks 238-2 highest, the empty memory blocks 238-1 second highest, and the empty memory blocks 238-P the lowest. In some embodiments, the rankings can correspond to an order in which the empty memory blocks 238-1 to 238-P will be used for receipt of data to be stored in the memory device 230. Accordingly, in this non-limiting example, the empty memory blocks 238-2 would be used first to store incoming data, the empty memory blocks 238-1 would be used second to store incoming data, and the empty memory blocks 238-P would be used last to store incoming data. Similarly, the controller 213 can determine the bake time for the empty memory blocks 238-1 to 238-P and can cause the empty memory blocks 238-1 to 238-P to be organized in a list and/or ranked from the highest bake time to the lowest bake time.

By ranking the empty memory blocks 238-1 to 238-P based on the bake temperature and/or the bake time and then prioritizing use of the empty memory blocks 238-1 to 238-P based on the bake temperature and/or the bake time, as described herein, degradation to the $V_O$ voltage window can be reduced (particularly around the $E_O$ region of the threshold voltage distribution) in comparison to approaches that do not employ such techniques. This can in turn lead to improvements in the functioning of the memory device 230 and, accordingly, to a memory sub-system in which the memory device 230 is deployed, particularly in large-scale enterprise type computing architectures.

In a non-limiting example, an apparatus includes a memory device 230 comprising a plurality of memory blocks 234-1 to 234-M and a controller 213 coupled to the memory device 230. The controller 213 can determine respective temperatures for empty memory blocks 238-1 to 238-P among the plurality of memory blocks 234-1 to 234-M and generate a list 239-1 to 239-N comprising address locations corresponding to each of the empty memory blocks 238-1 to 238-P. In some embodiments, the list 239-1 to 239-N is organized according to the determined respective temperatures of the empty memory blocks 238-1 to 238-P among the plurality of memory blocks 234-1 to 234-M.

The controller 213 can determine whether a temperature of a particular empty memory block (e.g., the empty memory block 238-1, the empty memory block 238-2, and/or the empty memory block 238-P, etc.) among the plurality of empty memory blocks 238-1 to 238-P in the list 239-1 to 239-N meets or exceeds a threshold operational temperature corresponding to the memory device 230. The controller 213 can then control writing of information to an address location corresponding to the particular empty memory block based, at least in part, on the determination that the temperature of the particular empty memory block meets or exceeds the threshold operational temperature of the memory device 230.

Continuing with this example, the controller 213 can update the list 239-1 to 239-N comprising the address locations corresponding to each of the plurality of empty memory blocks 238-1 to 238-P in response to writing the information to the particular empty memory block. For example, the controller 213 can write addresses (e.g., logical addresses that map to physical memory cells of the memory blocks) and/or pointers that involve such addresses corresponding to the empty memory blocks 238-1 to 238-P in the list 239-1 to 239-N such that the empty memory blocks 238-1 to 238-N can be identified and accessed in subsequent operations.

In some embodiments, the controller 213 can control writing of the information to an address location corresponding to a random empty memory block in the list based, at least in part, on a determination that the temperature of the particular empty memory block does not meet or exceed the threshold operational temperature of the memory device 230. For example, as described in more detail in connection with FIG. 3, herein, if no empty memory blocks 238-1 to 238-P in the list 239-1 to 239-N have a temperature that is greater than the threshold operational temperature of the memory device 230, there may be no benefit to using one of the empty memory blocks 239-1 to 238-P in the list 239-1 to 239-N so any memory block that is available to be written to may be used.

The controller 213 can determine that none of the empty memory blocks among the plurality of empty memory blocks 238-1 to 238-P in the list 239-1 to 239-N meets or exceeds the threshold operational temperature corresponding to the memory device 230 and update the threshold operational temperature of the memory device 230 to a second threshold operational temperature that is less than the threshold operational temperature of the memory device 230. For example, if none of the empty memory blocks 238-1 to 238-P in the list 239-1 to 239-N have a temperature that meets or exceeds the threshold operational temperature of the memory device 230, the threshold operational temperature of the memory device 230 can be decreased such that at least some of the empty memory blocks 238-1 to 238-P have a temperature that meets or exceeds the threshold operational temperature of the memory device 230.

In some embodiments, the controller 213 can determine whether a temperature of an empty memory block among the plurality of empty memory blocks 238-1 to 238-P in the list 239-1 to 239-N meets or exceeds the second threshold operational temperature corresponding to the memory device 230 and write information to the empty memory block in the list 239-1 to 239-N that exceeds the second threshold operational temperature corresponding to the memory device 230 responsive to the determination.

The controller 213 can, in some embodiments, determine respective amounts of time that the empty memory blocks among the plurality of memory blocks 238-1 to 238-P have been exposed to the temperature, and generate the list 239-1 to 239-N comprising the address locations corresponding to each of the empty memory blocks 238-1 to 238-P, wherein the list 239-1 to 239-N is further organized according to the determined respective amounts of time that the empty memory blocks among the plurality of memory blocks 238-1 to 238-P have been exposed to the temperature. In such embodiments, the controller 213 can determine whether an amount of time that the particular empty memory block among the plurality of memory blocks 238-1 to 238-P in the list 239-1 to 239-N meets or exceeds a threshold amount of time associated with exposure to the temperature among the plurality of empty memory blocks 238-1 to 238-P in the list 239-1 to 239-N and control writing of information to the address location corresponding to the particular empty memory block based, at least in part, on the determination that the amount of time that the particular empty memory block among the plurality of memory blocks 238-1 to 238-P in the list 239-1 to 239-N meets or exceeds the threshold amount of time associated with exposure to the temperature among the plurality of empty memory blocks 238-1 to 238-P in the list 239-1 to 239-N.

Continuing with this non-limiting example, the controller 213 can determine the respective temperatures for the empty memory blocks among the plurality of memory blocks 238-1 to 238-P by activating one or more word lines coupled to the empty memory blocks among the plurality of memory blocks 238-1 to 238-P and determining activity associated with the empty memory blocks among the plurality of memory blocks 238-1 to 238-P based on activation of the one or more word lines coupled to the empty memory blocks. For example, the controller 213 can determine a frequency and/or a recency of activation of word lines coupled to the empty memory blocks to determine if the empty memory blocks are active enough to have reached a temperature that is high enough for inclusion on the list(s) 239-1 to 239-N described herein.

Embodiments are not so limited; however, and in some embodiments, the controller 213 can determine the respective temperatures for the empty memory blocks among the plurality of memory blocks 238-1 to 238-P by accessing one or more system records corresponding to temperatures of the plurality of memory blocks 239-1 to 238-P. For example, the controller 213 can access temperature data recorded by the memory device 230 and analyze the temperature data to determine if the empty memory blocks are active enough to have reached a temperature that is high enough for inclusion on the list(s) 239-1 to 239-N described herein.

In some embodiments, the controller 213 can perform at least one of the operations described above in the absence of receipt a command or other signaling from a host (e.g., the host system 120 illustrated in FIG. 1, herein) couplable to the memory device 230. Accordingly, the controller 213 can perform the operations described herein during runtime of the memory device 230 without encumbering the host. This can reduce data traffic across an interface coupling the memory device 230 to the host thereby improving the efficiency and/or speed of the memory device while reducing power consumed in data transfer operations prevalent in some other approaches.

In a different non-limiting example, an apparatus can include a memory device 230 comprising a plurality of memory blocks 234-1 to 234-M and a processing device (e.g., the controller 213) coupled to the memory device 230. The processing device can determine that the memory device 230 has reached or exceeded an operational temperature threshold and generate a list 239-1 to 239-N of memory blocks among the plurality of memory blocks 234-1 to 234-M. The processing device can sort the list 239-1 to 239-N of memory blocks such that the memory blocks associated with the list 239-1 to 239-N are ranked based on a determined temperature of each memory block among the plurality of memory blocks 234-1 to 234-M and/or a determined amount of time or time period that each memory block among the plurality of memory blocks 234-1 to 234-M in the list 239-1 to 239-N has experienced the determined temperature.

The processing device can determine whether a temperature of an empty memory block 238-1 to 238-P among the plurality of memory blocks 234-1 to 234-M in the ranked list 239-1 to 239-N meets or exceeds a threshold operational temperature corresponding to the memory device 230 and/or whether the determined amount of time that the empty memory block 238-1 to 238-P among the plurality of memory blocks 234-1 to 234-M in the ranked list 239-1 to 239-N has experienced the determined temperature meets or exceeds a threshold amount of time corresponding to the determined temperature. The processing device can further control writing of information to the empty memory block 238-1 to 238-P based, at least in part on a determination that the temperature (e.g., the bake temperature) of the empty memory block 238-1 to 238-P in the ranked list 239-1 to 239-N meets or exceeds the threshold operational temperature of the memory device 230 and/or a determination that the amount of time (e.g., the bake time) that the empty memory block 238-1 to 238-P in the ranked list 239-1 to 239-N has experienced the determined temperature meets or exceeds the threshold amount of time corresponding to the determined temperature.

As described in more detail in connection with FIG. 3, herein, the processing device can cause the ranked list 239-1 to 239-N to be updated in response to writing the information to the empty memory block 238-1 to 238-P. For example, the processing device can cause a record in the ranked list 239-1 to 239-N corresponding to the empty memory block 238-1 to 238-P to which the information was written subsequent to control of writing the information to the empty memory block 238-1 to 238-P to be deleted and/or updated.

Continuing with this non-limiting example, the processing device can be configured to determine that none of the empty memory blocks 238-1 to 238-P among the plurality of memory blocks 234-1 to 234-M in the ranked list 239-1 to 239-N meets or exceeds the threshold operational temperature corresponding to the memory device 230 or determine that none of the empty memory blocks 238-1 to 238-P among the plurality of memory blocks 234-1 to 234-M in the ranked list 239-1 to 239-N has experienced the determined temperature meets or exceeds the threshold amount of time corresponding to the determined temperature. In such embodiments, the processing device can be further configured to update the threshold operational temperature of the memory device 230 to a second threshold operational temperature that is less than the threshold operational temperature of the memory device 230 (e.g., that is less than the prior or "first" threshold operational temperature of the memory device).

In some embodiments, as described in more detail in connection with FIG. 3, herein, the processing device can be configured to determine that none of the empty memory blocks among the plurality of memory blocks 238-1 to 238-P in the ranked list 239-1 to 239-N meets or exceeds the threshold operational temperature corresponding to the memory device 230 or determine that none of the empty memory blocks among the plurality of memory blocks 238-1 to 238-P in the ranked list 239-1 to 239-N has experienced the determined temperature meets or exceeds the threshold amount of time corresponding to the determined temperature. In such embodiments, the processing device can be configured to control writing of information to a random empty memory block based on the determination that none of the empty memory blocks 238-1 to 238-P among the plurality of memory blocks 234-1 to 234-M in the ranked list 239-1 to 239-N meets and/or exceeds the threshold operational temperature corresponding to the memory device 230 or the determination that none of the empty memory blocks 238-1 to 239-P among the plurality of memory blocks 234-1 to 234-M in the ranked list 239-1 to 239-N has experienced the determined temperature meets or exceeds the threshold amount of time corresponding to the determined temperature.

Figure 3:
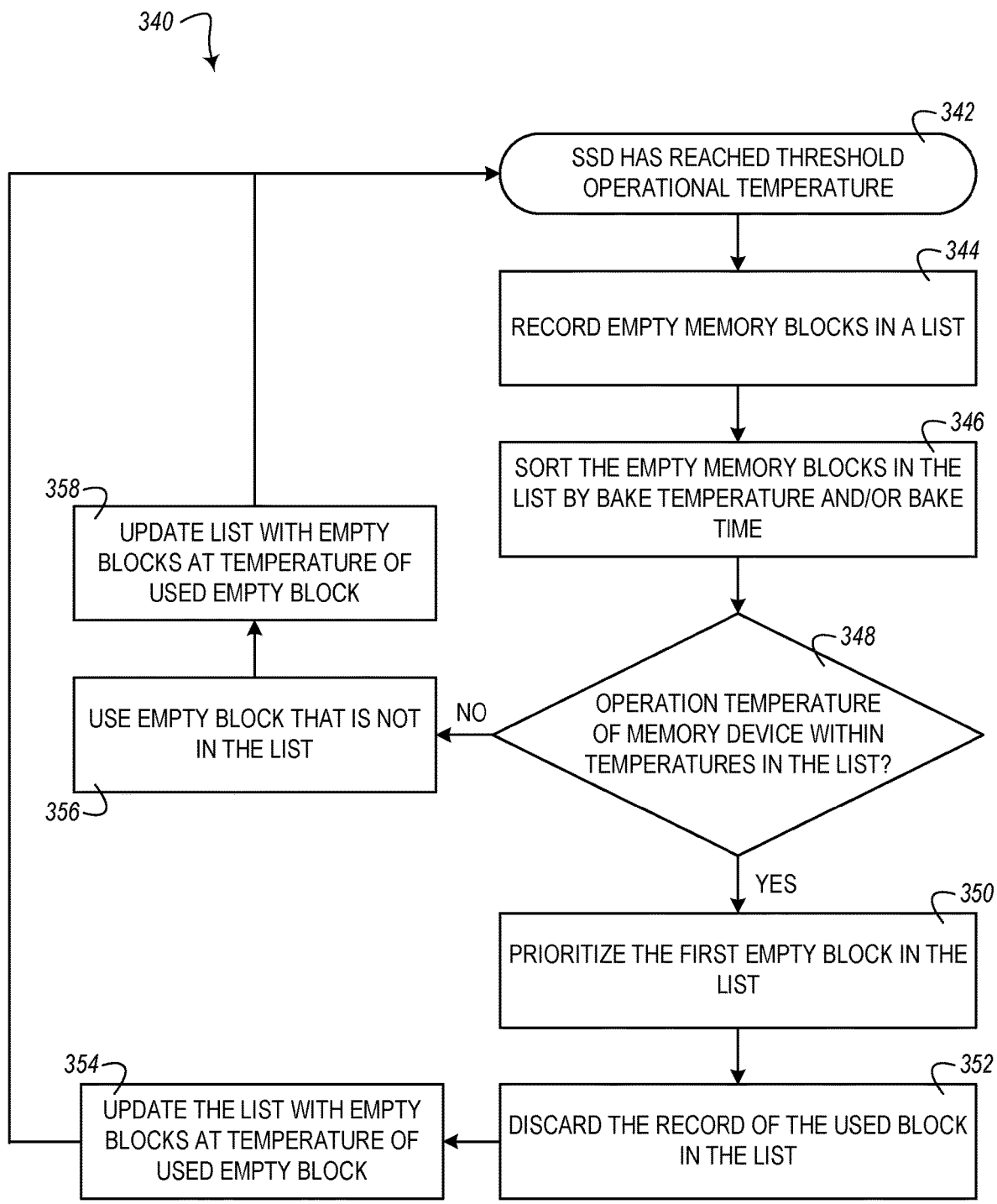
FIG. 3 is a flow diagram for memory block characteristic determination in accordance with some embodiments of the present disclosure.

FIG. 3 is a flow diagram 340 for memory block characteristic determination in accordance with some embodiments of the present disclosure. Operations corresponding to the flow 340 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the flow 340 is performed by the memory block characteristic determination component 113 of FIG. 1, the controller 213 of FIG. 2, and/or other similar circuitry. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 342, it can be determined that a solid-state drive (e.g., the memory sub-system 110 of FIG. 1) has reached a threshold operational temperature. As described above, in some embodiments, the threshold operating temperature can be around 85° Celsius, although embodiments are not limited to this particular threshold operating temperature. For example, the threshold operating temperature can be greater than or less than 85° Celsius, provided that the threshold operating temperature is at least greater than a temperature when the solid-state drive is not in an operational mode.

At operation 344, empty memory blocks (e.g., the empty memory blocks 238-1 to 238-P illustrated in FIG. 2) can be recorded in a list (e.g., the list(s) 239-1 to 239-N illustrated in FIG. 2). In some embodiments, addresses and/or pointers to addresses associated with the empty memory blocks can be recorded in the list. The empty memory blocks (e.g., the addresses and/or pointers associated with the empty memory blocks) can be recorded in the list in response to signaling and/or commands generated by a controller (e.g., the controller 213 illustrated in FIG. 2), a processing device, and/or a memory block characteristic determination component (e.g., the memory block characteristic determination component 113 illustrated in FIG. 1).

At operation 346, the empty memory blocks in the list can be sorted based on a bake temperature and/or a bake time associated with the empty memory blocks. In some embodiments, the empty blocks are sorted from a highest bake temperature to a lowest bake temperature such that the empty memory blocks that have the highest bake temperature are allocated first as data is received to be written to an empty memory block. Similarly, in some embodiments, the empty blocks are sorted from a highest bake time to a lowest bake time such that the empty memory blocks that have the highest bake time are allocated first as data is received to be written to an empty memory block. In embodiments in which the empty memory blocks are sorted based on both the bake temperature and the bake time, a weighted value that corresponds to both the bake temperature and the bake time can be determined for each of the empty memory blocks and the empty memory blocks can be sorted based on the weighted value.

At operation 348, a determination can be made as to whether the threshold operational temperature of the memory device falls within bake temperatures (and/or bake times) of the empty memory blocks in the list. Stated alternatively, at operation 348 it can be determined whether empty memory blocks in the list have a bake temperature that is greater than the threshold operational temperature of the memory device, as will be further described below in an illustrative example.

If the threshold operational temperature of the memory device does not fall within the bake temperatures (and/or the bake times) of the empty memory blocks in the list, at operation 356, an empty block that is not in the list can be used (e.g., can be allocated first) as data is received to be written to an empty memory block). That is, if the bake temperatures (and/or bake times) of all the empty memory blocks in the list are below the threshold operational temperature of the memory device, at operation 356 any randomly selected empty memory block can be allocated for receipt of data. Continuing along this path of the flow 340, at operation 358, the list can be updated to include empty memory blocks that have the same bake temperature and/or bake time as the randomly selected memory block that was allocated for receipt of data and the flow 340 can continue to operation 342.

Conversely, if the operational temperature of the memory device falls within the bake temperatures and/or bake times associated with empty memory blocks in the list, at operation 350, the first empty memory block in the list can be prioritized and allocated for receipt of data. That is, at operation 350, the empty memory block in the list having the highest bake temperature and/or the longest bake time can be allocated to receive data that is to be written to the memory device.

At operation 352, a record corresponding to the used empty memory block in the list can be discarded. For example, because the first empty memory block in the list was allocated to receive data at operation 350, information corresponding to that empty memory block can be discarded (e.g., removed) from the list.

At operation 354, the list can be updated to include empty memory blocks that are at the same (or higher) bake temperature than the empty memory block that was used at operation 350. That is, in order to maintain enough empty memory blocks in the list, the list can be updated in response to empty memory blocks in the list being used (e.g., allocated) for receipt and storage of incoming data.

In an illustrative, non-limiting example following the path including operations 348, 350, 352, and 354, the threshold operational temperature of the memory device may be 80° Celsius. It may then be determined at operation 348 that an empty memory block in the list has a bake temperature of 100° Celsius. The empty memory block having the bake temperature of 100° Celsius can be prioritized for use at operation 350. At operation 352, a record in the list corresponding to the empty memory block having the bake temperature of 100° Celsius can be discarded and, at operation 354, the list can be updated. For example, if the empty memory block in the list having the second highest bake temperature has a bake temperature of 75° Celsius, the list can be updated to include empty memory blocks that have a bake temperature of greater than 80° Celsius to coincide with the threshold operational temperature of the memory device.

In another illustrative, non-limiting example following the path including operations 348, 356, and 358, the threshold operational temperature of the memory device may be 80° Celsius. It may then be determined at operation 348 that no empty memory blocks in the list have a bake temperature of 80° Celsius. In such scenarios, at operation 356, any empty memory block may be used to receive data to be written to the memory device. In some embodiments, the threshold operational temperature of the memory device can be lowered (e.g., to 75° Celsius) in order to allow for empty memory blocks that have a bake temperature greater than 75° Celsius to be used for incoming data. Embodiments are not so limited, however, and in some embodiments, the empty memory blocks in the list can be updated to include empty memory blocks with lower temperatures at operation 358. For example, if the empty memory block that was used had a bake temperature of 70° Celsius, the list can be updated to include additional memory blocks that have a bake temperature of 70° Celsius.

Figure 4:
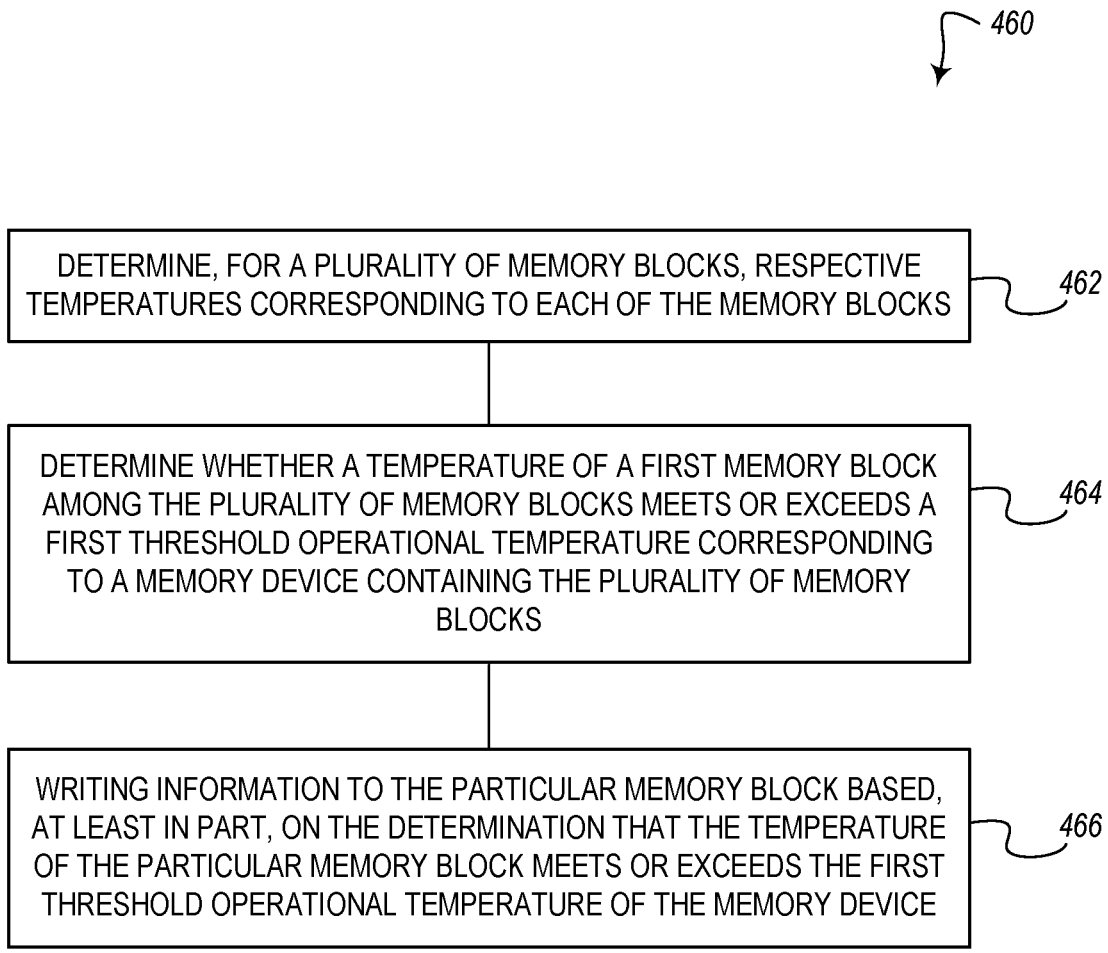
FIG. 4 is a flow diagram corresponding to a method for memory block characteristic determination in accordance with some embodiments of the present disclosure.

FIG. 4 is a flow diagram corresponding to a method 460 for memory block characteristic determination in accordance with some embodiments of the present disclosure. The method 460 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 460 is performed by the memory block characteristic determination component 113 of FIG. 1, the controller 213 of FIG. 2, and/or other similar circuitry. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 462, respective temperatures corresponding to each memory block among a plurality of memory blocks (e.g., the memory blocks 234-1 to 234-M illustrated in FIG. 2, herein) can be determined. For example, an operation including determining, for a plurality of memory blocks, respective temperatures corresponding to each of the memory blocks can be performed. In some embodiments, the memory blocks can be empty memory blocks (e.g., the empty memory blocks 238-1 to 238-P illustrated in FIG. 2, herein).

At operation 464, a determination as to whether a temperature of a particular memory block (e.g., a first memory block) among the plurality of memory blocks meets or exceeds a threshold operational temperature (e.g., a first threshold operating temperature) corresponding to a memory device (e.g., the memory device 130 illustrated in FIG. 1 and/or the memory device 230 illustrated in FIG. 2, herein) containing the plurality of memory blocks. For example, an operation including determining whether a temperature of a particular memory block among the plurality of memory blocks meets or exceeds a threshold operational temperature corresponding to a memory device containing the plurality of memory blocks can be performed.

At operation 466, information can be written to the particular memory block based on the determination that the temperature of the particular memory block meets or exceeds the threshold operational temperature of the memory device. For example, an operation including writing information to the particular memory block based, at least in part, on the determination that the temperature of the particular memory block meets or exceeds the threshold operational temperature of the memory device can be performed. Conversely, the information can be written to a random memory block based, at least in part, on determining that the temperature of the particular memory block does not meet or exceed the threshold operational temperature of the memory device.

The method 460 can include generating a sorted list of each of the plurality of memory blocks based on the determined respective temperatures corresponding to each of the plurality of memory blocks. The sorted list can be written to one or more of the lists 239-1 to 239-N illustrated in FIG. 2, herein. In some embodiments, the method 460 can further include updating the sorted list of each of the plurality of memory blocks (e.g., empty memory blocks) in response to writing the information to the particular memory block, as described in more detail in connection with FIG. 3, herein.

The method 460 can include determining that none of the memory blocks among the plurality of memory blocks meets or exceeds the threshold operational temperature (e.g., the first threshold operating temperature) corresponding to the memory device and updating the threshold operational temperature of the memory device to a different threshold operational temperature (e.g., a second threshold operating temperature) that is less than the threshold operational temperature of the memory device. For example, if it is determined that none of the memory blocks (or empty memory blocks) meet or exceed the threshold operational temperature corresponding to the memory device, the threshold operational temperature of the memory device can be decreased or increased to a different (e.g., new) threshold operational temperature. In such embodiments, the method 460 can further include determining whether a temperature of a memory block among the plurality of memory blocks meets or exceeds the second threshold operational temperature corresponding to the memory device and writing information to the memory block that meets or exceeds the second threshold operational temperature of the memory device.

In some embodiments, the method 460 can include determining that the temperature of the particular memory block is the same as a temperature of a different (e.g., a second) memory block (e.g., has an identical or nearly identical bake temperature as a different empty memory block in the list).

The method 460 can further include determining an amount of time or "time period" (e.g., a bake time) the particular memory block and the different memory block have experienced their respective temperatures and writing information to the particular memory block or the different (e.g., the second) memory block that has experienced their respective temperature for a greater amount of time or time period.

Figure 5:
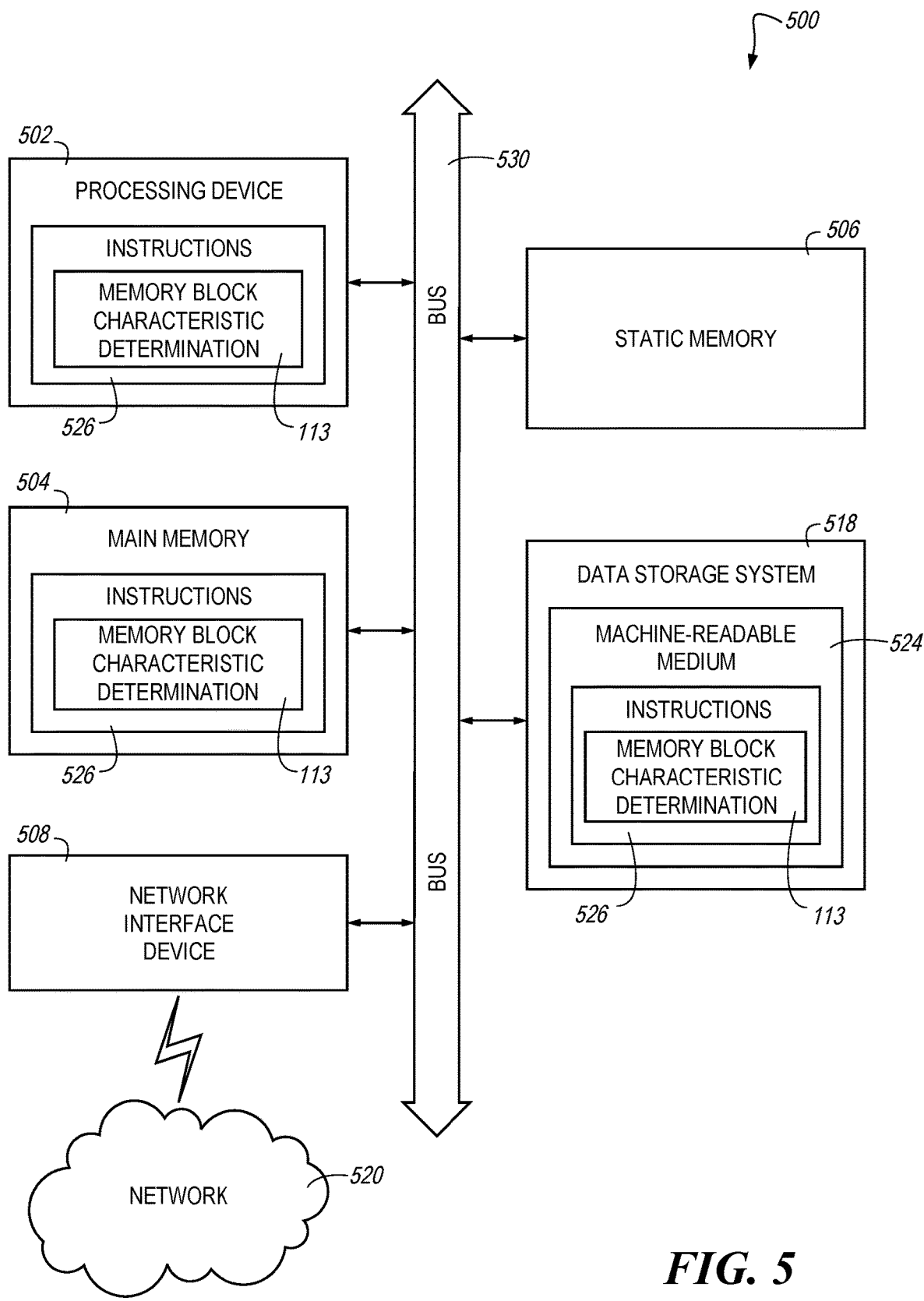
FIG. 5 is a block diagram of an example computer system in which embodiments of the present disclosure may operate.

FIG. 5 is a block diagram of an example computer system 500 in which embodiments of the present disclosure may operate. For example, FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the memory block characteristic determination component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a memory block characteristic determination component (e.g., the memory block characteristic determination component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
   determining, for a plurality of memory blocks, respective temperatures corresponding to each of the memory blocks;
   determining whether a temperature of a first memory block among the plurality of memory blocks meets or exceeds a first threshold operational temperature corresponding to a memory device containing the plurality of memory blocks;
   writing information to a particular memory block based on the determination that the temperature of the first memory block meets or exceeds the first threshold operational temperature of the memory device; and
   updating the first threshold operational temperature of the memory device to a second threshold operational temperature that is less than the first threshold operational temperature of the memory device based on determining that none of the memory blocks among the plurality of memory blocks meets or exceeds the first threshold operational temperature corresponding to the memory device.

2. The method of claim 1, further comprising generating a sorted list of each of the plurality of memory blocks based on the determined respective temperatures corresponding to each of the plurality of memory blocks.

3. The method of claim 2, further comprising updating the sorted list of each of the plurality of memory blocks in response to writing the information to the particular memory block.

4. The method of claim 1, further comprising writing the information to a random memory block based, at least in part, on determining that the temperature of the first memory block does not meet or exceed the first threshold operational temperature of the memory device.

5. The method of claim 1, further comprising:
   determining whether a temperature of a memory block among the plurality of memory blocks meets or exceeds the second threshold operational temperature corresponding to the memory device; and
   writing information to the memory block that meets or exceeds the second threshold operational temperature of the memory device.

6. The method of claim 1, further comprising:
   determining that the temperature of the first memory block is the same as a temperature of a second memory block;
   determining a time period that the first memory block and the second memory block have experienced their respective temperatures; and
   writing information to the first memory block or the second memory block that has experienced their respective temperature for a greater time period.

7. An apparatus, comprising:
   a memory device comprising a plurality of memory blocks; and
   a controller coupled to the memory device, wherein the controller is configured to:
   determine respective temperatures for empty memory blocks among the plurality of memory blocks;
   generate a list comprising address locations corresponding to each of the empty memory blocks, wherein the list is organized according to the determined respective temperatures of the empty memory blocks among the plurality of memory blocks;
   determine whether a temperature of a particular empty memory block among the plurality of empty memory blocks in the list meets or exceeds a first threshold operational temperature corresponding to the memory device;
   control writing of information to an address location corresponding to the particular empty memory block based, at least in part, on the determination that the temperature of the particular empty memory block meets or exceeds the first threshold operational temperature of the memory device; and
   update the first threshold operational temperature of the memory device to a second threshold operational temperature that is less than the first threshold operational temperature of the memory device based on determining that none of the empty memory blocks among the plurality of empty memory blocks in the list meets or exceeds the first threshold operational temperature corresponding to the memory device.

8. The apparatus of claim 7, wherein the controller is configured to update the list comprising the address locations corresponding to each of the plurality of empty memory blocks in response to writing the information to the particular empty memory block.

9. The apparatus of claim 7, wherein the controller is configured to control writing of the information to an address location corresponding to a random empty memory block in the list based, at least in part, on a determination that the temperature of the particular empty memory block does not meet or exceed the first threshold operational temperature of the memory device.

10. The apparatus of claim 7, wherein the controller is further configured to:
    determine whether a temperature of an empty memory block among the plurality of empty memory blocks in the list meets or exceeds the second threshold operational temperature corresponding to the memory device; and write information to the empty memory block in the list that exceeds the second threshold operational temperature corresponding to the memory device responsive to the determination.

11. The apparatus of claim 7, wherein the controller is further configured to:
determine respective time periods that the empty memory blocks among the plurality of memory blocks have been exposed to the temperature;
generate the list comprising the address locations corresponding to each of the empty memory blocks, wherein the list is further organized according to the determined respective time periods that the empty memory blocks among the plurality of memory blocks have been exposed to the temperature;
determine whether a time period that the particular empty memory block among the plurality of memory blocks in the list meets or exceeds a threshold time period associated with exposure to the temperature among the plurality of empty memory blocks in the list; and
control writing of information to the address location corresponding to the particular empty memory block based, at least in part, on the determination that the time period that the particular empty memory block among the plurality of memory blocks in the list meets or exceeds the threshold time period associated with exposure to the temperature among the plurality of empty memory blocks in the list.

12. The apparatus of claim 7, wherein the controller is configured to determine the respective temperatures for the empty memory blocks among the plurality of memory blocks by:
activating one or more word lines coupled to the empty memory blocks among the plurality of memory blocks; and
determining activity associated with the empty memory blocks among the plurality of memory blocks based on activation of the one or more word lines coupled to the empty memory blocks.

13. The apparatus of claim 7, wherein the controller is configured to determine the respective temperatures for the empty memory blocks among the plurality of memory blocks by accessing one or more system records corresponding to temperatures of the plurality of memory blocks.

14. An apparatus, comprising:
a memory device comprising a plurality of memory blocks; and
a processing device coupled to the memory device, wherein the processing device is configured to:
determine that the memory device has reached or exceeded an operational temperature threshold;
generate a list of memory blocks among the plurality of memory blocks;
sort the list of memory blocks such that the memory blocks associated with the list are ranked based on a determined temperature of each memory block among the plurality of memory blocks, or a determined amount of time that each memory block among the plurality of memory blocks in the list has experienced the determined temperature, or both;
determine whether a temperature of an empty memory block among the plurality of memory blocks in the ranked list meets or exceeds a first threshold operational temperature corresponding to the memory device or whether the determined amount of time that the empty memory block among the plurality of memory blocks in the ranked list has experienced the determined temperature meets or exceeds a threshold amount of time corresponding to the determined temperature, or both;
control writing of information to the empty memory block based on:
a determination that the temperature of the empty memory block in the ranked list meets or exceeds the first threshold operational temperature of the memory device, or
a determination that the amount of time that the empty memory block in the ranked list has experienced the determined temperature meets or exceeds the threshold amount of time corresponding to the determined temperature, or both; and
update the first threshold operational temperature of the memory device to a second threshold operational temperature that is less than the first threshold operational temperature of the memory device based on:
a determination that none of the empty memory blocks among the plurality of memory blocks in the ranked list meets or exceeds the first threshold operational temperature corresponding to the memory device, or
a determination that none of the empty memory blocks among the plurality of memory blocks in the ranked list has experienced the determined temperature meets or exceeds the threshold amount of time corresponding to the determined temperature.

15. The apparatus of claim 14, wherein the processing device is configured to update the ranked list in response to writing the information to the empty memory block.

16. The apparatus of claim 14, wherein the processing device is configured to:
determine that none of the empty memory blocks among the plurality of memory blocks in the ranked list meets or exceeds the first threshold operational temperature corresponding to the memory device, or
determine that none of the empty memory blocks among the plurality of memory blocks in the ranked list has experienced the determined temperature meets or exceeds the threshold amount of time corresponding to the determined temperature; and
control writing of information to a random empty memory block based on the determination that none of the empty memory blocks among the plurality of memory blocks in the ranked list meets or exceeds the first threshold operational temperature corresponding to the memory device or the determination that none of the empty memory blocks among the plurality of memory blocks in the ranked list has experienced the determined temperature meets or exceeds the threshold amount of time corresponding to the determined temperature, or both.

17. The apparatus of claim 14, wherein the processing device is configured to delete a record in the ranked list corresponding to the empty memory block to which the information was written subsequent to control of writing the information to the empty memory block.

18. A method, comprising:
determining, for a plurality of memory blocks, respective temperatures corresponding to each of the memory blocks;

determining whether a temperature of a first memory block among the plurality of memory blocks meets or exceeds a first threshold operational temperature corresponding to a memory device containing the plurality of memory blocks;

determining that none of the memory blocks among the plurality of memory blocks meets or exceeds the first threshold operational temperature corresponding to the memory device;

updating the first threshold operational temperature of the memory device to a second threshold operational temperature that is less than the first threshold operational temperature of the memory device;

determining whether a temperature of a memory block among the plurality of memory blocks meets or exceeds the second threshold operational temperature corresponding to the memory device; and writing information to the memory block that meets or exceeds the second threshold operational temperature of the memory device.

19. A method, comprising:

determining, for a plurality of memory blocks, respective temperatures corresponding to each of the memory blocks;

determining a temperature of a first memory block among the plurality of memory blocks meets or exceeds a first threshold operational temperature corresponding to a memory device containing the plurality of memory blocks;

determining that the temperature of the first memory block is the same as a temperature of a second memory block;

determining a time period that the first memory block and the second memory block have experienced their respective temperatures; and writing information to the first memory block or the second memory block that has experienced their respective temperature for a greater time period.

20. An apparatus, comprising:

a memory device comprising a plurality of memory blocks; and a controller coupled to the memory device, wherein the controller is configured to:

determine respective temperatures for empty memory blocks among the plurality of memory blocks;

generate a list comprising address locations corresponding to each of the empty memory blocks, wherein the list is organized according to the determined respective temperatures of the empty memory blocks among the plurality of memory blocks;

determine whether a temperature of a particular empty memory block among the plurality of empty memory blocks in the list meets or exceeds a first threshold operational temperature corresponding to the memory device;

determine that none of the empty memory blocks among the plurality of empty memory blocks in the list meets or exceeds the first threshold operational temperature corresponding to the memory device;

update the first threshold operational temperature of the memory device to a second threshold operational temperature that is less than the first threshold operational temperature of the memory device;

determine whether a temperature of an empty memory block among the plurality of empty memory blocks in the list meets or exceeds the second threshold operational temperature corresponding to the memory device; and control writing of information to the empty memory block in the list based, at least in part, on the determination that the temperature of the empty memory block meets or exceeds the second threshold operational temperature of the memory device.

21. An apparatus, comprising:

a memory device comprising a plurality of memory blocks; and a controller coupled to the memory device, wherein the controller is configured to:

determine respective temperatures for empty memory blocks among the plurality of memory blocks;

determine respective time periods that the empty memory blocks among the plurality of memory blocks have been exposed to the temperature;

generate a list comprising address locations corresponding to each of the empty memory blocks among the plurality of memory blocks, wherein the list is organized according to the determined respective temperatures of the empty memory blocks and the determined respective time periods that the empty memory blocks have been exposed to the temperature;

determine whether a temperature of a particular empty memory block among the plurality of empty memory blocks in the list meets or exceeds a first threshold operational temperature corresponding to the memory device;

determine whether a time period that the particular empty memory block among the plurality of memory blocks in the list meets or exceeds a threshold time period associated with exposure to the temperature among the plurality of empty memory blocks in the list; and control writing of information to an address location corresponding to the particular empty memory block based, at least in part, on the determination that the temperature of the particular empty memory block meets or exceeds the first threshold operational temperature of the memory device and the time period that the particular empty memory block meets or exceeds the threshold time period.

22. An apparatus, comprising:

a memory device comprising a plurality of memory blocks; and a controller coupled to the memory device, wherein the controller is configured to:

determine respective temperatures for empty memory blocks among the plurality of memory blocks by:

activating one or more word lines coupled to the empty memory blocks among the plurality of memory blocks; and determining activity associated with the empty memory blocks among the plurality of memory blocks based on activation of the one or more word lines coupled to the empty memory blocks;

generate a list comprising address locations corresponding to each of the empty memory blocks, wherein the list is organized according to the determined respective temperatures of the empty memory blocks among the plurality of memory blocks;

determine whether a temperature of a particular empty memory block among the plurality of empty memory blocks in the list meets or exceeds a first threshold operational temperature corresponding to the memory device; and control writing of information to an address location corresponding to the particular empty memory block based, at least in part, on the determination that the temperature of the particular empty memory block meets or exceeds the first threshold operational temperature of the memory device.

23. An apparatus, comprising:
a memory device comprising a plurality of memory blocks; and
a processing device coupled to the memory device, wherein the processing device is configured to:
  determine that the memory device has reached or exceeded an operational temperature threshold;
  generate a list of memory blocks among the plurality of memory blocks;
  sort the list of memory blocks such that the memory blocks associated with the list are ranked based on a determined temperature of each memory block among the plurality of memory blocks, or a determined amount of time that each memory block among the plurality of memory blocks in the list has experienced the determined temperature, or both;
  determine whether a temperature of an empty memory block among the plurality of memory blocks in the ranked list meets or exceeds a first threshold operational temperature corresponding to the memory device or whether the determined amount of time that the empty memory block among the plurality of memory blocks in the ranked list has experienced the determined temperature meets or exceeds a threshold amount of time corresponding to the determined temperature, or both;
  determine that none of the empty memory blocks among the plurality of memory blocks in the ranked list meets or exceeds the first threshold operational temperature corresponding to the memory device, or
  determine that none of the empty memory blocks among the plurality of memory blocks in the ranked list has experienced the determined temperature meets or exceeds the threshold amount of time corresponding to the determined temperature; and
  control writing of information to a random empty memory block based on the determination that none of the empty memory blocks among the plurality of memory blocks in the ranked list meets or exceeds the first threshold operational temperature corresponding to the memory device or the determination that none of the empty memory blocks among the plurality of memory blocks in the ranked list has experienced the determined temperature meets or exceeds the threshold amount of time corresponding to the determined temperature, or both.

24. An apparatus, comprising:
a memory device comprising a plurality of memory blocks; and
a processing device coupled to the memory device, wherein the processing device is configured to:
  determine that the memory device has reached or exceeded an operational temperature threshold;
  generate a list of memory blocks among the plurality of memory blocks;
  sort the list of memory blocks such that the memory blocks associated with the list are ranked based on a determined temperature of each memory block among the plurality of memory blocks, or a determined amount of time that each memory block among the plurality of memory blocks in the list has experienced the determined temperature, or both;
  determine whether a temperature of an empty memory block among the plurality of memory blocks in the ranked list meets or exceeds a first threshold operational temperature corresponding to the memory device or whether the determined amount of time that the empty memory block among the plurality of memory blocks in the ranked list has experienced the determined temperature meets or exceeds a threshold amount of time corresponding to the determined temperature, or both;
  control writing of information to the empty memory block based on:
    a determination that the temperature of the empty memory block in the ranked list meets or exceeds the first threshold operational temperature of the memory device, or a determination that the amount of time that the empty memory block in the ranked list has experienced the determined temperature meets or exceeds the threshold amount of time corresponding to the determined temperature, or both; and
  delete a record in the ranked list corresponding to the empty memory block to which the information was written subsequent to control of writing the information to the empty memory block.

* * * * *